(12) United States Patent
Shelby

(10) Patent No.: US 9,662,897 B2
(45) Date of Patent: May 30, 2017

(54) ADDRESSING FOR A MEMORY DEVICE USED IN AN IMAGE RECORDING APPARATUS

(71) Applicant: Static Control Components, Inc., Sanford, NC (US)

(72) Inventor: Michael Larkin Shelby, Cary, NC (US)

(73) Assignee: Static Control Components, Inc., Sanford, NC (US)

(*) Notice: Subject to any disclaimer, the term of this patent is extended or adjusted under 35 U.S.C. 154(b) by 0 days.

(21) Appl. No.: 15/159,854

(22) Filed: May 20, 2016

(65) Prior Publication Data

US 2016/0263907 A1 Sep. 15, 2016

Related U.S. Application Data

(63) Continuation of application No. 14/286,125, filed on May 23, 2014, now Pat. No. 9,346,275, which is a
(Continued)

(51) Int. Cl.
*G03G 15/08* (2006.01)
*B41J 2/175* (2006.01)
(Continued)

(52) U.S. Cl.
CPC ....... *B41J 2/17546* (2013.01); *B41J 2/17503* (2013.01); *G03G 15/0863* (2013.01); *G03G 15/55* (2013.01); *G03G 21/1882* (2013.01); *G11C 8/00* (2013.01); *B41J 2/41* (2013.01); *G03G 15/0855* (2013.01); *G03G 15/0865* (2013.01); *G03G 15/5075* (2013.01); *G03G 21/1892* (2013.01); *G03G 2215/00109* (2013.01); *G03G 2221/1663* (2013.01); *G03G 2221/1823* (2013.01); *G03G 2221/1838* (2013.01); *G06F 11/0733* (2013.01); *G06F 11/2294* (2013.01)

(58) Field of Classification Search
CPC ...................................................... G03G 15/00
USPC ............................................................ 399/8
See application file for complete search history.

(56) References Cited

U.S. PATENT DOCUMENTS 4,851,875 A * 7/1989 Tanimoto ............. G03G 15/553
399/12
5,995,774 A * 11/1999 Applegate .......... G03G 21/1889
399/27
(Continued)

OTHER PUBLICATIONS

D.F. Warne, Newnes Electrical Power Engineer's Handbook Second Edition, Newnes, 2005, p. 57, fig. 3.12.*

*Primary Examiner* — Clayton E LaBalle
*Assistant Examiner* — Kevin Butler

(57) ABSTRACT

Many devices, such as printers, work with one or more removable unit. Often, the removable units have an electronic circuit that used to communicate with the device. It may be desirable to provide a replacement unit in these devices. The replacement unit must include an electronic circuit that is able to communicate with the original device. Disclosed is a method and apparatus where a replacement unit is provided with a new electronic circuit and a used electronic circuit. The new electronic circuit is electrically connected to the used electronic circuit and uses the used electronic circuit to facilitate communication with the host device.

9 Claims, 2 Drawing Sheets

Related U.S. Application Data continuation of application No. 13/098,953, filed on May 2, 2011, now Pat. No. 8,737,849.

(51) Int. Cl.

| | |
|---|---|
| *G11C 8/00* | (2006.01) |
| *G06F 11/22* | (2006.01) |
| *G06F 11/07* | (2006.01) |
| *G03G 21/18* | (2006.01) |
| *G03G 15/00* | (2006.01) |
| *B41J 2/41* | (2006.01) |

(56) References Cited

U.S. PATENT DOCUMENTS

| | | | | |
|---|---|---|---|---|
| 6,000,773 A * | 12/1999 | Murray | ................ | B41J 2/1752 347/7 |
| 6,104,888 A * | 8/2000 | Kobayashi | ........ | G03G 21/1875 399/12 |
| 6,253,277 B1 * | 6/2001 | Lakhani | ............ | G06F 12/0661 711/218 |
| 6,418,283 B1 * | 7/2002 | Wegman | ............ | B41J 2/17533 116/100 |
| 6,473,571 B1 * | 10/2002 | Wegman | ............ | B41J 2/17533 399/12 |
| 6,882,810 B2 * | 4/2005 | Karagiannis | ....... | G03G 21/1652 399/109 |
| 7,099,599 B2 * | 8/2006 | Karagiannis | ........ | G03G 15/553 399/27 |
| 7,099,606 B2 * | 8/2006 | Karagiannis | ........ | G03G 15/553 399/109 |
| 7,286,249 B2 * | 10/2007 | Engel | ................ | B41J 2/17546 358/1.14 |
| 7,398,033 B2 * | 7/2008 | Karagiannis | ........ | G03G 15/553 399/109 |
| 7,596,329 B2 * | 9/2009 | Burchette | ............ | G03G 15/065 399/27 |
| 7,869,074 B2 * | 1/2011 | Uno | ................ | G06F 3/0605 358/1.13 |
| 8,131,169 B2 * | 3/2012 | Kuntz | ................ | G03G 15/2053 399/24 |
| 8,145,723 B2 * | 3/2012 | Arimilli | ................ | G06F 9/3009 709/212 |
| 8,905,511 B2 * | 12/2014 | Thacker | ............... | G03G 15/556 347/19 |
| 9,170,545 B2 * | 10/2015 | Eom | ................ | G03G 15/0863 |
| 2003/0011409 A1 * | 1/2003 | Altrichter | ........ | G01R 31/31701 327/112 |
| 2003/0093612 A1 * | 5/2003 | Ootani | ................ | G06F 12/0246 711/103 |
| 2003/0133331 A1 * | 7/2003 | LaBerge | .................. | G11C 7/22 365/191 |
| 2004/0120723 A1 * | 6/2004 | Ito | ...................... | G03G 21/1892 399/12 |
| 2006/0072145 A1 * | 4/2006 | Simpson | ............ | G03G 15/5075 358/1.15 |
| 2006/0227359 A1 * | 10/2006 | Ream | ..................... | G03G 15/55 358/1.14 |
| 2006/0283933 A1 * | 12/2006 | Ueda | .................... | H04N 1/2346 235/375 |
| 2006/0285859 A1 * | 12/2006 | Cook | .................. | G03G 15/553 399/24 |
| 2007/0071458 A1 * | 3/2007 | Tanaka | ................. | B41J 2/17566 399/12 |
| 2008/0267641 A1 * | 10/2008 | Konishi | ............ | G03G 15/0806 399/27 |
| 2008/0276048 A1 * | 11/2008 | Booth | ....................... | G11C 8/12 711/148 |
| 2010/0268790 A1 * | 10/2010 | Arimilli | ................ | G06F 9/3009 709/217 |
| 2011/0093702 A1 * | 4/2011 | Eom | .................... | G03G 15/553 713/168 |
| 2011/0158659 A1 * | 6/2011 | Tarao | ............... | G03G 15/5016 399/8 |
| 2012/0014701 A1 * | 1/2012 | Tokuno | .............. | G03G 15/5079 399/12 |
| 2012/0076515 A1 * | 3/2012 | Rapkin | ................ | G03G 15/556 399/24 |
| 2012/0076517 A1 * | 3/2012 | Rapkin | .............. | G03G 15/5079 399/24 |
| 2012/0076518 A1 * | 3/2012 | Rapkin | .............. | G03G 15/5079 399/24 |
| 2012/0281993 A1 * | 11/2012 | Shelby | ............... | G03G 15/0863 399/8 |
| 2014/0253615 A1 * | 9/2014 | Shelby | ............... | G03G 15/0863 347/6 |
| 2015/0110504 A1 * | 4/2015 | Lee | ....................... | G03G 15/55 399/12 |
| 2016/0055402 A1 * | 2/2016 | Fister | .................. | G06F 12/0661 358/1.14 |

\* cited by examiner

ADDRESSING FOR A MEMORY DEVICE USED IN AN IMAGE RECORDING APPARATUS

This application is a continuation of allowed U.S. patent application Ser. No. 14/286,125 entitled "Addressing for a Memory Device Used in an Image Recording Apparatus" filed May 23, 2014 now U.S. Pat. No. 9,346,275, which is a continuation of allowed U.S. patent application Ser. No. 13/098,953 entitled "Addressing for a Memory Device Used in an Image Recording Apparatus" filed May 2, 2011 now U.S. Pat. No. 8,737,849, which is incorporated by reference herein in its entirety.

BACKGROUND

Many electronic devices have components that include an integrated memory. Often, the manufacturer of these devices wants to monitor usage to determine a remaining life of the device. One example of these devices is a printer having a memory on a printing cartridge.

The host device must be able to communicate with the memory in order to receive the information stored in the memory device and to command updating of the information stored in the memory device.

U.S. Pat. No. 7,844,786 discloses addressing and command protocols for addressing an electronic circuit having a non-volatile memory. As shown in FIG. 1, the processing device 101 controls a voltage regulator 102 that provides a voltage source 104 to the memory modules 103a, reference 106. *The processing device 101 may exchange data with one or more of the non-volatile memory modules 103a, 103b, . . . 103x through an address/data channel 108.* The controlling computer system 101 may also provide a common time reference to the memory modules 103a, 103b, . . . 103x through a clock channel 121. A conductor 114 with a set of discrete voltage levels is provided through the use of resistors 118, and where each discrete voltage level corresponds to a particular bit position in the memory module address.

This patent discloses that a busy/available status may be provided on the first channel by effectively "anding" the busy/available output signals from each of the memory modules through the use of an open-collector/open-drain 112. The open-collector/open-drain 112 may include one or more common resistors and one or more capacitors. In such a configuration, each memory module 103a, 103b, . . . 103x may output a high voltage signal if it is able to accept a command, or a low voltage signal if it is busy executing a command. Thus, if all of the memory modules 103a, 103b, . . . 103x are available, then the first channel signal may be pulled up to a "high" voltage by the resistor in the open-collector/open-drain 112, signifying that all of the memory modules 103a, 103b, . . . 103x are available.

This patent also teaches that if any memory module 103a, 103b, . . . 103x is busy, then the first channel signal may be pulled to a "low" voltage close to ground by the open-collector/open-drain 112. If at least one memory module 103a, 103b, . . . 103x is busy, the processing device 101 may wait until the first channel signal is pulled to a high voltage level before issuing a subsequent command to the memory modules 103a, 103b, . . . 103x. In this manner, the processing device 101 may synchronize the memory modules 103a, 103b, . . . 103x before issuing a common command, such as an increment counter command, to a plurality of the memory modules 103a, 103b, . . . 103x. Similarly the second channel may also effectively "and" the error/no-error output signals from each of the memory modules. This may also be provided with another open-collector/open-drain 112 having a common resistor and capacitor.

Each of the memory modules 103a, 103b, . . . 103x may output a high voltage signal on the second channel when there is no error detected and a low voltage signal if an error is detected. Thus, if one of the memory modules 103a, 103b, . . . 103x has an error, the second channel may be pulled to a low voltage by the open-collector/open-drain 112, signifying that at least one memory module 103a, 103b, . . . 103x contains an error. If all of the memory modules 103a, 103b, . . . 103x are error-free, then the second channel may be pulled to a high voltage. All of the memory modules 103a, 103b, . . . 103x will be ready and error-free if the first and second channels are at a high voltage level. It will be appreciated by one of ordinary skill that there are many alternatives to the "anding" function of open-collector/open drain 112 discussed above. For example, a plurality of physical "and" gates can be used instead of the open-collector/open-drain 112.

The status channel 110 may include only a single channel capable of representing the ready, error, and busy states for the memory modules 103a, 103b, . . . 103x. When only a single channel is used, all addressed memory modules 103a, 103b, . . . 103x may release their respective busy signals from a low voltage level to a high voltage level after each finishes processing its current command. The status channel 110 may then be pulled to a high voltage level by the open-drain/open-collector 112. Once the addressed memory modules 103a, 103b, . . . 103x have completed their commands and released each of their output signals above the low voltage, any memory module that needs to report an error may hold the status channel 110 at an intermediate voltage level that is higher than the low voltage level (e.g., close to ground) but lower than the high voltage (e.g., approximately 3.3V). For instance, each of the memory modules 103a, 103b, . . . 103x may use a 1.5V Zener diode component to ground to provide the intermediate voltage level. Other methods of providing an intermediate voltage levels may alternatively be implementing using resistors, as is known in the art, such as using a 5.1 KOhms resistance to ground to provide the intermediate voltage level. In this way, a single status channel 110 may be sufficient for reporting the ready, error, and busy states of the memory modules 103a, 103b, . . . 103x thereby reducing the electrical connections required between the processing device 101 and the memory modules 103a, 103b, . . . 103x.

A disadvantage of to the above addressing scheme is that it requires additional elements to provide three voltage levels at one channel.

SUMMARY

The present device and methods allows for a device having a memory to be remanufactured and to allow the remanufactured device to properly communicate with a host device.

One method is for communicating between an electronic circuit located on a replaceable unit and a host device. The method includes providing a replaceable unit for use in a host device, providing a first electronic circuit on the replaceable unit, and providing a second electronic circuit on the replaceable unit, wherein the second electronic circuit is in communication with the first electronic circuit. A signal is received from the host device at the replaceable unit. Information is received from the first electronic circuit at the host device. The host device reads three levels from the replaceable unit, the first electronic circuit provides two levels to the host device and the second electronic circuit provides a third level to the host device. The first electronic circuit indicates two levels by using a high level voltage and a low voltage and the second electronic circuit indicates a third level by using a middle voltage level.

One embodiment describes an image recording device having a replaceable unit for use in the image recording device. A first electronic circuit is located on the replaceable unit and a second electronic circuit located on the replaceable unit, wherein the second electronic circuit is in communication with the first electronic circuit. An interface receives a signal from the host device at the first electronic circuit, wherein information from the first electronic circuit is indicated to the image recording device by reading three levels from the interface, and the first electronic circuit provides two levels to the host device and the second electronic circuit provides a third level to the host device.

In another method a first electronic circuit is provided and a second electronic circuit is acquired, wherein the second electronic circuit has been previously used. The first electronic circuit is mounted on a first substrate and the second electronic is mounted on a second substrate and the first electronic circuit is electrically connected to the second circuit. The first substrate and the second substrate may be the same substrate or they may be different substrates. Alternatively, one of the electronic circuits may be mounted directly on top of the other electronic circuit.

The methods and apparatuses above allow for an electronic circuit to communicate to a host device by using multiple voltage levels. This allows the electronic circuit to communicate a larger amount of information to the host device.

Another advantage is that a consumable device having a memory mounted therein can be reused when the memory has been damaged or disabled. The recovered memory from the consumable device can be electronically connected to another chip having a memory device. The chip can communicate to the host using two voltage levels and use the recovered memory to provide a third voltage level.

These and other features and objects of the invention will be more fully understood from the following detailed description of the embodiments, which should be read in light of the accompanying drawings.

In this regard, before explaining at least one embodiment of the invention in detail, it is to be understood that the invention is not limited in its application to the details of construction and to the arrangements of the components set forth in the description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be used as a basis for designing other structures, methods, and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

The accompanying drawings, which are incorporated in and form a part of the specification, illustrate embodiments of the present invention and, together with the description, serve to explain the principles of the invention.

DETAILED DESCRIPTION OF THE DRAWINGS

Figure 1:
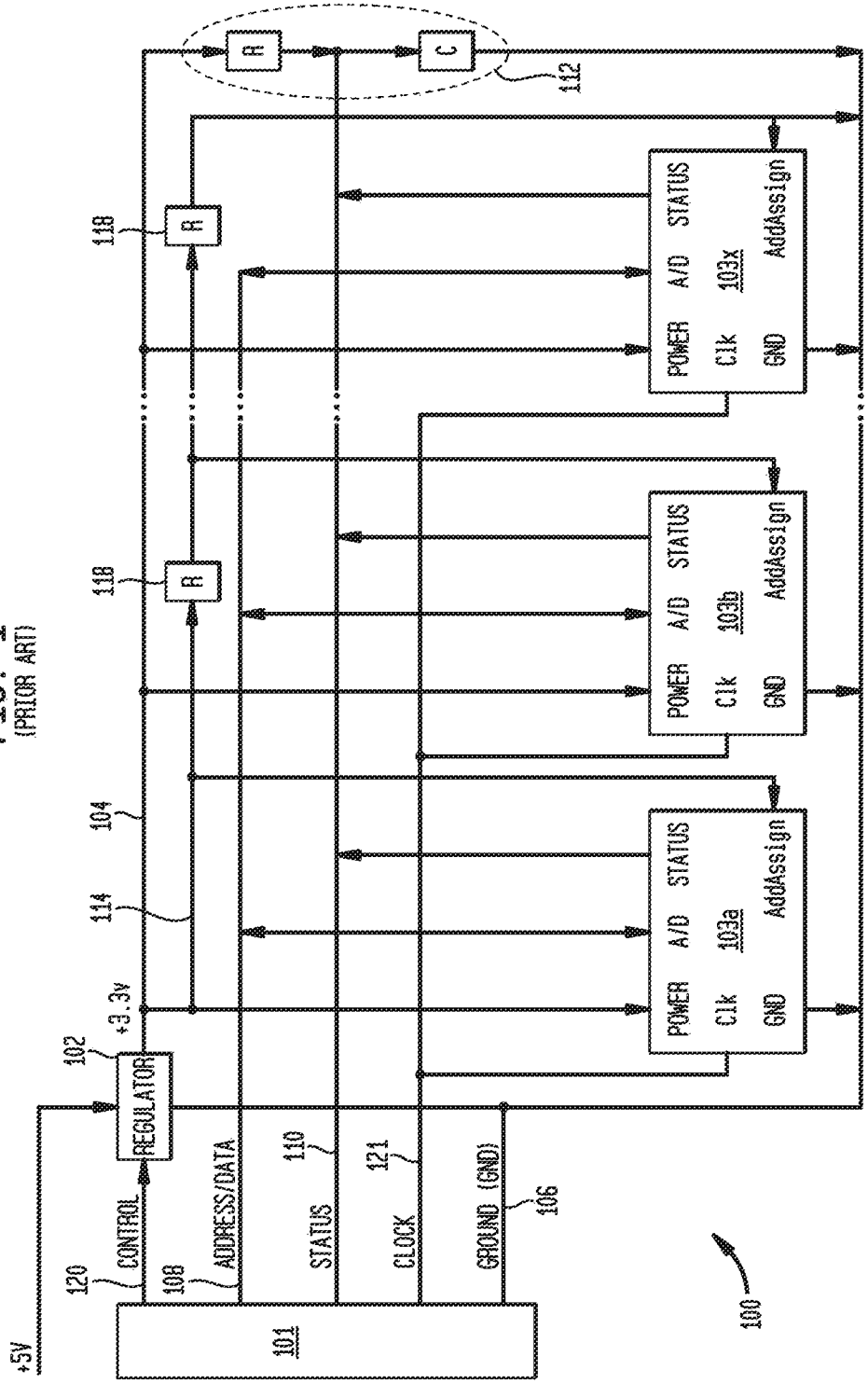
FIG. 1 illustrates a prior art electrical interface for communication between a processor and multiple memory devices.

In describing an embodiment of the invention illustrated in the drawings, specific terminology will be used for the sake of clarity. However, the invention is not intended to be limited to the specific terms so selected, and it is to be understood that each specific term includes all technical equivalents which operate in a similar manner to accomplish a similar purpose.

Figure 2:
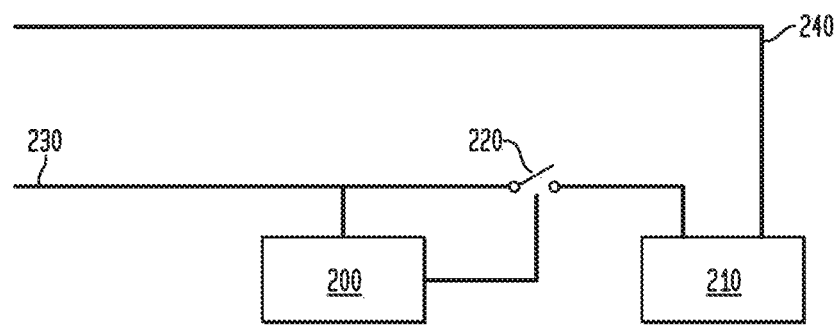
FIG. 2 illustrates an embodiment where two electronic circuits are connected via a switch.

FIG. 2 illustrates an embodiment where two electronic circuits are connected via a switch. Electronic circuit 200 is connected to electronic circuit 210 via switch 220. Electronic circuit 200 communicates with the host device via an address channel 230. Electronic circuit 200 is configured to communicate to the host device with two voltage levels, a high voltage level and a low voltage level. The high voltage may be any desired voltage level but in a preferred embodiment is set to 5 volts. The low level may be any desired lower level but in a preferred embodiment is set to 0 volts. Electronic circuit 200 also communicates to the host via a status channel 240. The status channel can be used to indicate that the electronic circuit 200 is busy or that an error has occurred. When electronic circuit 200 is communicating with the host device and is busy or in an error state, electronic circuit 200 needs to communicate using a medium voltage level. The switch 220 is activated connecting electronic 210 to electronic circuit 200. This brings the high voltage level (for example 5 volts) down to medium voltage level. The medium voltage level may be set to any level that is between the high voltage level and the low voltage level. In a preferred embodiment the medium voltage level is set to 3.3 volts. By connecting electronic circuit 200 to electronic circuit 210 via the switch 220 the electronic circuit 200 is able to communicate with the host device using three voltage levels without the need to provide any complicated circuitry to generate all three voltage levels.

In one embodiment, electronic circuit 210 is an electronic circuit located on a printer cartridge. Typically printer cartridges, in both electrostatic printers and inkjet printers, are removable and replaceable. Printer cartridges often have an electronic circuit that communicates with a processor or other electronic device located within the printer. Often, the electronic circuit 210 contains one or more memory locations storing information that enables the printer cartridge to operate within the printer. This information may include a serial number, a print material level indication, an authentication code, or any other desired information.

It is desirable to be able to reuse, refill, or remanufacture the print cartridge in order to save resources and reduce waste, but, many printer manufactures store information in the electronic circuit 210 in a manner that prevents reusing the printer cartridge. For example, the electronic circuit 210 may contain information that the print cartridge has been previously used and is not authorized for reuse. Electronic circuit 200 is a replacement circuit that can be used on a remanufactured or recycled device in place of electronic circuit 210. Electronic circuit 200 can contain everything necessary and all of the information that was originally located in electronic circuit 210. This allows the printer cartridge to be reused and remanufactured.

Figure 3:
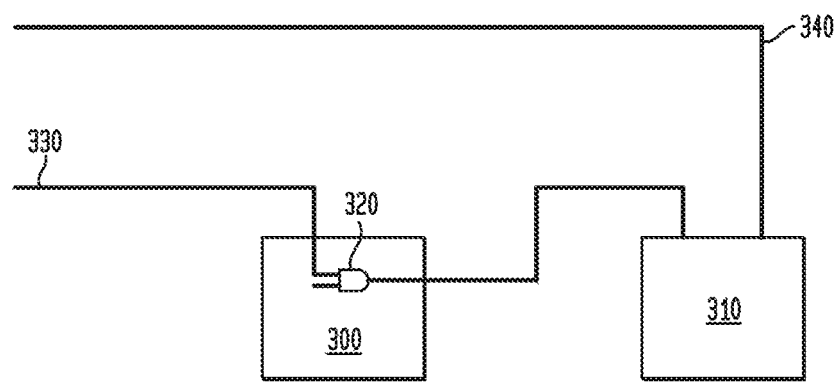
FIG. 3 illustrates an embodiment where the two electronic circuits are connected without a switch.

FIG. 3 illustrates an embodiment where two electronic circuits are in electrical communication without using a switch. Electronic circuit 300 is connected to electronic circuit 310 without using a switch. Electronic circuit 300 contains internal logic 320 in place of a switch. Electronic circuit 300 communicates with the host device via an address channel 330. Electronic circuit 300 is configured to communicate to the host device with two voltage levels, a high voltage level and a low voltage level. The high voltage may be any desired voltage level but in a preferred embodiment is set to 5 volts. The low level may be any desired lower level but in a preferred embodiment is set to 0 volts. Electronic circuit 300 also communicates to the host via a status channel 340. The status channel can be used to indicate that the electronic circuit 300 is busy or that an error has occurred. When electronic circuit 300 is communicating with the host device and is busy or in an error state, electronic circuit 300 needs to communicate using a medium voltage level. The internal logic 320 is causes activation of electronic circuit 310. This brings the high voltage level (for example 5 volts) down to medium voltage level. The medium voltage level may be set to any level that is between the high voltage level and the low voltage level. In a preferred embodiment the medium voltage level is set to 3.3 volts. By connecting electronic circuit 300 to electronic circuit 310 via the internal logic 320 the electronic circuit 300 is able to communicate with the host device using three voltage levels without the need to provide any complicated circuitry to generate all three voltage levels.

Although internal logic 320 is illustrated as an AND gate any desired digital logic circuitry can be used. Also, an operational amplifier or transistor may be used as an internal device that controls activation of electronic circuit 310.

The many features and advantages of the invention are apparent from the detailed specification. Thus, the appended claims are intended to cover all such features and advantages of the invention which fall within the true spirits and scope of the invention. Further, since numerous modifications and variations will readily occur to those skilled in the art, it is not desired to limit the invention to the exact construction and operation illustrated and described. Accordingly, all appropriate modifications and equivalents may be included within the scope of the invention.

Although this invention has been illustrated by reference to specific embodiments, it will be apparent to those skilled in the art that various changes and modifications may be made which clearly fall within the scope of the invention. The invention is intended to be protected broadly within the spirit and scope of the appended claims.

What is claimed is:

1. A printer cartridge comprising:
   a first electronic circuit adapted for communication with a printing device, the first electronic circuit adapted for providing two levels to the printing device;
   a second electronic circuit communicably connected to the first electronic circuit, the second electronic circuit adapted for providing a third level to the printing device.

2. The printer cartridge of claim 1, wherein the first electronic circuit indicates two levels by using a high level voltage and a low voltage.

3. The printer cartridge of claim 1, wherein the second electronic circuit indicates one level by using a middle level voltage.

4. The printer cartridge of claim 1 further comprising:
   switching means located communicatively between the first electronic circuit and the second electronic circuit, wherein the switching means is for activating communication with the second electronic circuit when it is desired to indicate a specific level.

5. The printer cartridge of claim 1, wherein the second electronic circuit comprises a chip that was provided by an original equipment manufacturer of the printer cartridge.

6. The printer cartridge of claim 5, wherein the consumable cartridge is an ink cartridge or a toner cartridge.

7. The printer cartridge of claim 1, wherein the first electronic circuit includes at least one memory device.

8. The printer cartridge of claim 7, wherein the memory device stores information about the printer cartridge.

9. The printer cartridge of claim 1 further comprising:
   an AND gate located in the first electronic circuit and the second electronic circuit, wherein the AND gate is controlled to activate communication with the second electronic circuit where it is desired to indicate a specific level.

* * * * *